(12) United States Patent
Inokuchi et al.

(10) Patent No.: US 8,958,239 B2
(45) Date of Patent: Feb. 17, 2015

(54) MAGNETIC MEMORY ELEMENT, MAGNETIC MEMORY DEVICE, SPIN TRANSISTOR, AND INTEGRATED CIRCUIT

(75) Inventors: Tomoaki Inokuchi, Yokohama (JP); Takao Marukame, Chuo-ku (JP); Mizue Ishikawa, Yokohama (JP); Hideyuki Sugiyama, Kawasaki (JP); Masahiko Nakayama, Yokohama (JP); Tatsuya Kishi, Yokohama (JP); Hiroaki Yoda, Yokohama (JP); Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 366 days.

(21) Appl. No.: 13/532,981

(22) Filed: Jun. 26, 2012

(65) Prior Publication Data
US 2013/0077388 A1  Mar. 28, 2013

(30) Foreign Application Priority Data
Sep. 26, 2011 (JP) ................... 2011-209986

(51) Int. Cl.
| | | |
|---|---|---|
| G11C 11/00 | (2006.01) | |
| G11C 11/16 | (2006.01) | |
| H01L 29/66 | (2006.01) | |
| H01L 43/08 | (2006.01) | |
| H01L 27/22 | (2006.01) | |
| H01L 29/06 | (2006.01) | |

(52) U.S. Cl.
CPC .......... *G11C 11/16* (2013.01); *H01L 29/66984* (2013.01); *H01L 43/08* (2013.01); *H01L 27/224* (2013.01); *H01L 29/0657* (2013.01)
USPC ............ 365/158; 365/171; 365/173; 365/148

(58) Field of Classification Search
USPC .................. 365/158, 171, 173, 148
See application file for complete search history.

(56) References Cited

U.S. PATENT DOCUMENTS

| | | | | |
|---|---|---|---|---|
| 6,256,223 | B1 | 7/2001 | Sun | |
| 7,342,244 | B2 * | 3/2008 | Kaushal et al. | 257/24 |
| 7,602,636 | B2 | 10/2009 | Saito et al. | |
| 2011/0228596 | A1 | 9/2011 | Inokuchi et al. | |
| 2013/0075843 | A1 * | 3/2013 | Inokuchi et al. | 257/421 |

FOREIGN PATENT DOCUMENTS

| | | |
|---|---|---|
| JP | 2010-80536 | 4/2010 |
| JP | 2010-219177 | 9/2010 |
| KR | 10-2005-0007589 | 1/2005 |

OTHER PUBLICATIONS

Office Action issued Jul. 18, 2013 in Korean Patent Application No. 10-2012-0067143 (with English translation).

(Continued)

*Primary Examiner* — Han Yang
(74) *Attorney, Agent, or Firm* — Oblon, Spivak, McClelland, Maier & Neustadt, L.L.P.

(57) ABSTRACT

One embodiment provides a magnetic memory element, including: a first ferromagnetic layer whose magnetization is variable; a second ferromagnetic layer which has a first band split into a valence band and a conduction band and a second band being continuous at least from the valence band to the conduction band; and a nonmagnetic layer provided between the first ferromagnetic layer and the second ferromagnetic layer.

17 Claims, 8 Drawing Sheets

(56) References Cited

OTHER PUBLICATIONS

J.C. Slonczewski, "Letter to the Editor—Current-driven excitation of magnetic multilayers", Journal of Magnetism and Magnetic Materials 159 (1996) L1-L7, 1996, 7 pages.

Office Action issued Nov. 21, 2014, in Japanese Patent Application No. 2011-209986, filed Sep. 26, 2011 (with partial English translation).

* cited by examiner

MAGNETIC MEMORY ELEMENT, MAGNETIC MEMORY DEVICE, SPIN TRANSISTOR, AND INTEGRATED CIRCUIT

CROSS-REFERENCE TO RELATED APPLICATION(S)

This application claims priority from Japanese Patent Application No. 2011-209986 filed on Sep. 26, 2011, the entire contents of which are incorporated herein by reference.

FIELD

Embodiments described herein relate generally to a magnetic memory element, a magnetic memory device, a spin transistor, and an integrated circuit.

BACKGROUND

A tunnel magnetoresistance device has a structure in which a tunnel insulating film is sandwiched by two ferromagnetic layers. When the tunnel magnetoresistance device is applied to a magnetoresistive random access memory (MRAM), one of the two ferromagnetic layers configuring the tunnel magnetoresistance device has a magnetization whose direction is fixed, and serves as a fixed layer (pinned layer). The other ferromagnetic layer is such that a magnetization is variable, and serves as a storage layer. Accordingly, the MRAM can store nonvolatile data and write and read data in a time equal to or less than 10 nanoseconds (ns). In addition, the MRAM can rewrite data more than $10^{15}$ times.

A spin injection magnetization switching method has been proposed as a method of writing information to each tunnel magnetoresistance device of an MRAM. The spin injection magnetization switching method is to reverse the magnetization of a storage layer of a tunnel magnetoresistance device of an MRAM by injecting spin-polarized electrons (or spin injection current) into the tunnel magnetoresistance device of the MRAM. The magnitude of spin injection current needed to write information to the tunnel magnetoresistance device of the MRAM is reduced with the miniaturization of the tunnel magnetoresistance device of the MRAMs. Thus, the spin injection magnetization switching method is promising as a method of writing information to each tunnel magnetoresistance device of an MRAM.

However, in order to write information to each tunnel magnetoresistance device of an MRAM using the spin injection magnetization switching method, it is necessary to apply electric-current bidirectionally to the tunnel magnetoresistance device of the MRAM. In a cross-point type structure in which each tunnel magnetoresistance device of the MRAM and a diode are connected in series between a bit line and a word line, electric-current can not be applied bidirectionally.

Even in a spin transistor having a tunnel magnetoresistance device at least at one of a source electrode and a drain electrode, electric-current is bidirectionally applied thereto at the writing of information thereto. Thus, a peripheral circuit is complicated.

BRIEF DESCRIPTION OF DRAWINGS

A general architecture that implements the various features of the present invention will now be described with reference to the drawings. The drawings and the associated descriptions are provided to illustrate embodiments and not to limit the scope of the present invention.

FIGS. 3A to 4B illustrate an operation of the first embodiment.

DETAILED DESCRIPTION

One embodiment provides a magnetic memory element, including: a first ferromagnetic layer whose magnetization is variable; a second ferromagnetic layer which has a first band split into a valence band and a conduction band and a second band being continuous at least from the valence band to the conduction band; and a nonmagnetic layer provided between the first ferromagnetic layer and the second ferromagnetic layer, wherein reading is performed by causing electrons to flow between the first ferromagnetic layer and the second ferromagnetic layer, and wherein writing is performed by applying a voltage corresponding to energy equal to or less than an energy difference from a Fermi level to the valence band of the second ferromagnetic layer between the first ferromagnetic layer and the second ferromagnetic layer, to thereby perform spin-injection of electrons of the second band of the second ferromagnetic layer into the first ferromagnetic layer, or applying a voltage corresponding to energy larger than the energy difference between the first ferromagnetic layer and the second ferromagnetic layer, to thereby perform spin-injection of electrons of the first band of the second ferromagnetic layer into the first ferromagnetic layer.

Hereinafter, embodiments are described with reference to the drawings in which like reference numerals designate like components. The drawings are schematic or, conceptual. For example, a thickness-width ratio in each portion and a proportionality among the portions are not necessarily the same as actual ones. Further, the same portion may be drawn differently in terms of the size/proportionality.

First Embodiment

Figure 1:
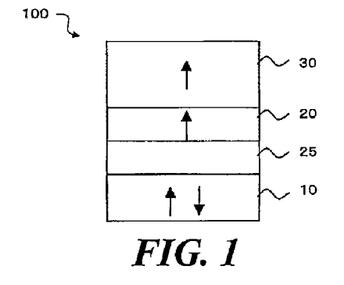
FIG. 1 illustrates a magnetic memory element according to a first embodiment.

FIG. 1 illustrates a magnetic memory element 100.

The magnetic memory element 100 includes a first ferromagnetic layer 10, a third ferromagnetic layer 30, a nonmagnetic layer 25 provided between the first ferromagnetic layer 10 and the third ferromagnetic layer 30, and a second ferromagnetic layer 20 provided between the third ferromagnetic layer 30 and the nonmagnetic layer 25. Arrows illustrated in FIG. 1 indicate the directions of magnetization. Although it is assumed that the magnetization is perpendicular to a film surface, the magnetization can be parallel to the film surface.

Another nonmagnetic layer 25 can be provided between the third ferromagnetic layer 30 and the second ferromagnetic layer 20.

The first ferromagnetic layer 10 is such that a magnetization is variable. For example, an alloy of at least one element selected from the group of Fe, Co, Ni, Mn, and Cr, and at least one element selected from the group of Pt, Pd, Ir, Ru, and Rh can be used as the material of the first ferromagnetic layer 10. Boron (B) can be added to such elements. The first ferromagnetic layer 10 can have a multilayer structure. The nonmagnetic layer 25 can be provided between adjacent-layers of the multilayer structure. The film-thickness of the first ferromagnetic layer 10 is equal to or thicker than 1 nanometers (nm) and equal to or thinner than 100 nm.

The third ferromagnetic layer 30 is such that a magnetization direction is fixed to one direction. For example, an alloy of at least one element selected from the group of Fe, Co, Ni, Mn, and Cr, and at least one element selected from the group of Pt, Pd, Ir, Ru, and Rh can be used as the material of the third ferromagnetic layer 30. Boron (B) can be added to such elements. The film-thickness of the third ferromagnetic layer 30 is equal to or thicker than 0.1 nm and equal to or thinner than 100 nm.

At least one element selected from the group of Cu, Ru, Cr, Au, Ag, Hf, Zr, Rh, Pt, Ir, Al, La, and Mg, or alloys of such elements, and oxides of such elements can be used as the material of the nonmagnetic layer 25. Alternatively, oxides or nitrides of Si, Ge, Al, Ga, Mg, Ti, or the like can be used as the material of the nonmagnetic layer 25. Another compound, e.g., SrTiO, NdGaO, or $Si_xGe_{1-x}$ (0<x<1) can be used as the material of the nonmagnetic layer 25. Alternatively, a III-V or II-VI group compound-semiconductor or magnetic-compound can be used as the material of the nonmagnetic layer 25.

The second ferromagnetic layer 20 includes a half metal. For example, a

Heusler alloy or a magnetic semiconductor can be used as the material of the second ferromagnetic layer 20.

The Heusler alloy is, e.g., $Co_2FeAl_{1-x}Si_x$ or $Co_2Mn_{1-x}Fe_xSi$ (0<x<1).

The magnetic semiconductor is, e.g., GeMn, SiCNi, SiCMn, SiCFe, ZnMnTe, ZnCrTe, BeMnTe, ZnVO, ZnMnO, ZnCoO, GaMnAs, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, or SiGeMn. A nonmagnetic element such as silver (Ag), copper (Cu), gold (Au), aluminum (Al), ruthenium (Ru), osmium (Os), rhenium (Re), tantalum (Ta), boron (B), carbon (C), oxygen (O), nitrogen (N), palladium (Pd), platinum (Pt), zirconium (Zr), iridium (Ir), tungsten (W), molybdenum (Mo), or niobium (Nb) can be added to the magnetic semiconductor. If such a nonmagnetic element is added to the magnetic semiconductor, physicalities, such as magnetic properties, crystallinities, mechanical properties, or chemical properties, can be adjusted.

Elements, such as Co, Fe, and Ni, or alloys of such elements can be used as the material of the second ferromagnetic layer 20. Other materials, e.g., alloys Co—Pt, Co—Fe—Pt, Fe—Pt, Co—Fe—Cr—Pt, Co—Cr—Pt, Co—Pd, and compounds NiMnSb, $Co_2MnGe$, $Co_2MnAl$, $Co_2MnSi$, or CoCrFeAl can be used as the material of the second ferromagnetic layer 20.

The film-thickness of the second ferromagnetic layer 20 is equal to or thicker than 0.4 nm and equal to or thinner than 5 nm. This is because the second ferromagnetic layer 20 is not superparamagnetic if the film-thickness of the second ferromagnetic layer 20 is within this range.

The nonmagnetic layer 25 can be provided between the third ferromagnetic layer 30 and the second ferromagnetic layer 20. Preferably, the first ferromagnetic layer 10 and the third ferromagnetic layer 30 have uniaxial magnetic anisotropy.

Figure 2:
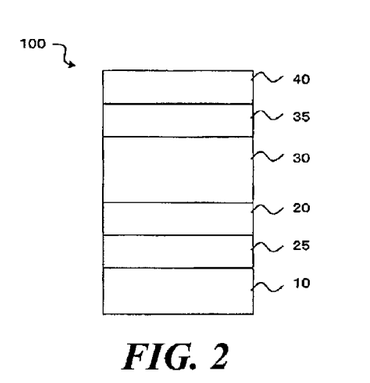
FIG. 2 illustrates another example of the first embodiment.

If the magnetization of the second ferromagnetic layer 20 is directed in an in-plane direction, as illustrated in FIG. 2, an antiferromagnetic layer 40 is provided on the third ferromagnetic layer 30 via an intermediate layer 35 made of Ru. For example, an iron-manganese (Fe—Mn) alloy, a platinum-manganese (Pt—Mn) alloy, a platinum-chromium-manganese (Pt—Cr—Mn) alloy, a nickel-manganese (Ni—Mn) alloy, an iridium-manganese (Ir—Mn) alloy, nickel oxide (NiO) or iron oxide ($Fe_2O_3$) can be used as the material of the antiferromagnetic layer 40. For example, the magnetization of the second ferromagnetic layer 20 can be directed in the in-plane direction, without providing the antiferromagnetic layer 40 thereon, by setting the film-thickness of the third ferromagnetic layer 30 to be thick, e.g., 10 nm or more.

A layer containing CoFe or CoFeB can be provided between the first ferromagnetic layer 10 and the nonmagnetic layer 25 or between the first ferromagnetic layer 10 and the second ferromagnetic layer 20.

Next, an operating principle of the magnetic memory element 100 is described.

Figure 3A:
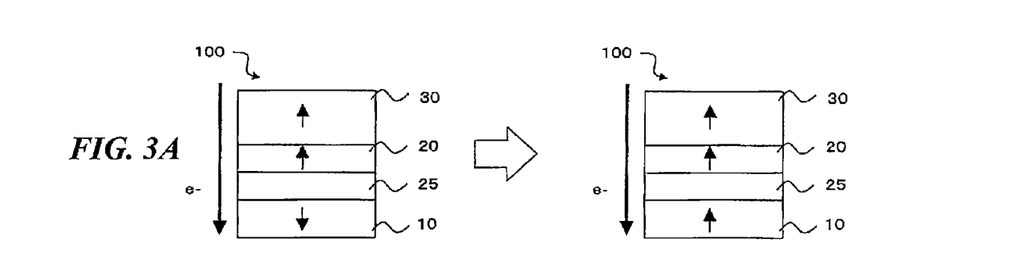
Figure 3B:
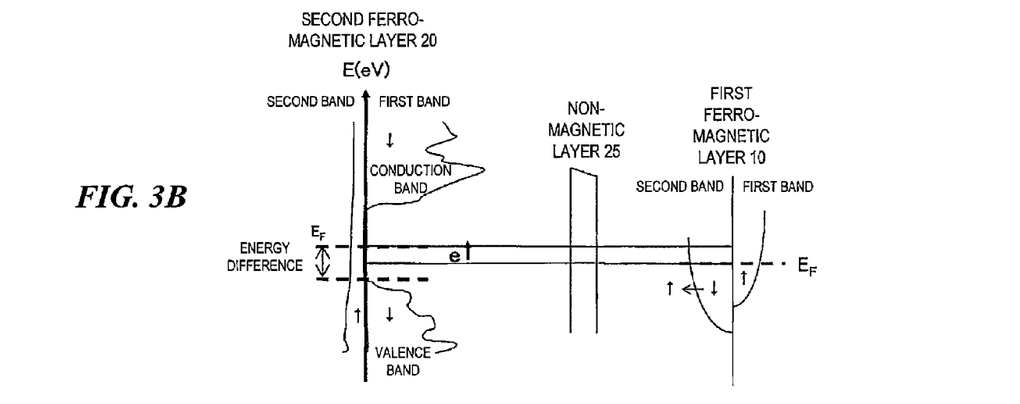

FIGS. 3A and 3B illustrate a write-operation of writing information to the magnetic memory element 100.

As illustrated in FIG. 3A, the magnetization of each of the first ferromagnetic layer 10, the second ferromagnetic layer 20, and the third ferromagnetic layer 30 is directed in a direction perpendicular to a film surface. Further, the magnetization of the first ferromagnetic layer 10 is assumed to be directed downward (down-spin) on a drawing sheet of FIG. 3A. And, the magnetization of each of the third ferromagnetic layer 30 and the second ferromagnetic layer 20 is assumed to be directed upward (up-spin) on the drawing sheet of FIG. 3A.

If electrons are caused to flow to the first ferromagnetic layer 10 from the third ferromagnetic layer 30, as illustrated in FIG. 3A, the electrons receive spin information representing the spin of the second ferromagnetic layer 20 and transfer the spin information to the first ferromagnetic layer 10 via the nonmagnetic layer 25. Thus, the spin of the electrons of the first ferromagnetic layer 10 is changed from a down-spin to an up-spin.

This will be more specifically explained as follows.

FIG. 3B illustrates the energy of each of the second ferromagnetic layer 20, the nonmagnetic layer 25, and the first ferromagnetic layer 10. The second ferromagnetic layer 20 is formed of a half metal. The first ferromagnetic layer 10 shows ferromagnetism. As illustrated in FIG. 3B, initially, the second ferromagnetic layer 20 has a first band in which electrons have a down-spin and a second band in which electrons have a up-spin, while the first ferromagnetic layer 10 has a first band in which electrons have the up-spin and a second band in which electrons have the down-spin.

Since the second ferromagnetic layer 20 is formed of a half metal, the second band corresponding to metal is continuous over a range from a low energy level to a high energy level, while the first band corresponding to semiconductor is split into a conduction band and a valence band. In the other words, the second band is continuous at least between the valence band and the conduction band.

Electrons having energy close to the Fermi level $E_F$ of the second ferromagnetic layer 20 contribute to electrical-conduction. As is seen from FIG. 3B, it is the second band that has electrons whose energy level is close to the Fermi level $E_F$.

Thus, the up-spin electrons of the second band of the second ferromagnetic layer 20 change the direction of the spin of the first ferromagnetic layer 10.

Since the Fermi level $E_F$ varies by an energy corresponding to a voltage applied between the first ferromagnetic layer 10 and the third ferromagnetic layer 30, if the energy corresponding to the applied voltage is larger than an energy difference from the Fermi level $E_F$ to the valence band's edge of the first band of the second ferromagnetic layer 20, electrons of the valence band of the first band may contribute to electrical-conduction. Thus, the applied voltage is limited so that an energy corresponding thereto does not exceed the energy difference. This voltage is referred to as a first voltage hereinafter.

By applying the first voltage between the first ferromagnetic layer 10 and the third ferromagnetic layer 30 and causing electrons to flow from the third ferromagnetic layer 30 to the first ferromagnetic layer 10, spin information representing the spin of the electrons of the first ferromagnetic layer 10 are rewritten due to the up-spin electrons of the second band of the second ferromagnetic layer 20 injected thereto, so that the spin information representing the down-spin is changed to the information representing the up-spin. Here, the voltage is applied such that the potential level of the third ferromagnetic layer 30 is higher than that of the first ferromagnetic layer 10.

At the reading of information from the magnetic memory element 100, a voltage lower than the first voltage is applied between the first ferromagnetic layer 10 and the third ferromagnetic layer 30 to thereby cause electrons to flow from the third ferromagnetic layer 30 to the first ferromagnetic layer 10. The magnetization direction of the first ferromagnetic layer 10 is substantially parallel to the magnetization direction of the third ferromagnetic layer 30. Accordingly, the magnetic memory element 100 exhibits a low resistance value.

Figure 4A:
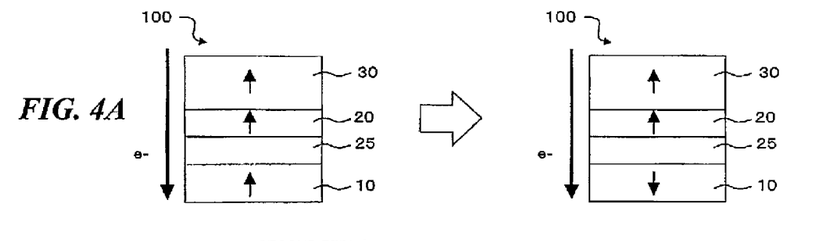
Figure 4B:
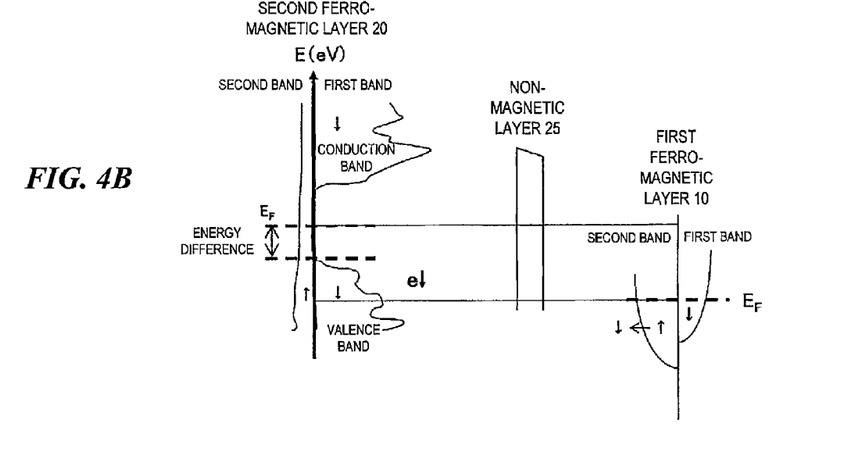

A case of changing the magnetization direction of the first ferromagnetic layer 10 from the up-spin to the down-spin, as illustrated in FIG. 4A, is described. In this case, a voltage corresponding to energy larger than an energy difference from the Fermi level $E_F$ to the valence band's edge of the first band of the second ferromagnetic layer 20, as illustrated in FIG. 4B, is applied therebetween to cause electrons to flow to the first ferromagnetic layer 10 from the third ferromagnetic layer 30. This voltage is hereinafter referred to as a second voltage. At that time, in the second ferromagnetic layer 20, the number of electrons of the valence band of the first band is larger than that of electrons of the second band. Accordingly, the electrons of the first band of the second ferromagnetic layer 20 contribute to electrical-conduction. Thus, spin information representing the spin of the electrons of the first ferromagnetic layer 10 are rewritten due to the down-spin electrons of the first band of the second ferromagnetic layer 20 injected thereto, so that the spin information representing the up-spin is changed to the information representing the down-spin. The voltage is applied such that the potential level of the third ferromagnetic layer 30 is higher than that of the first ferromagnetic layer 10.

At an energy level at the valence band's edge of the first band of the second ferromagnetic layer 20 illustrated in FIG. 4B, the state density of the second band is higher than that of the first band. Actually, the state density of the second band is lower than that of the first band. Thus, the electrons of the first band of the second ferromagnetic layer 20 are caused to contribute to electric-conduction by applying, between the first ferromagnetic layer 10 and the third ferromagnetic layer 30, a voltage corresponding to energy larger than the energy difference from the Fermi level $E_F$ to the valence band's edge of the first band of the second ferromagnetic layer 20 and by causing the electrons to flow to the first ferromagnetic layer 10 from the third ferromagnetic layer 30.

At the reading of information from the magnetic memory element 100, a voltage lower than the second voltage is applied between the first ferromagnetic layer 10 and the third ferromagnetic layer 30 to cause electrons to flow to the first ferromagnetic layer 10 from the third ferromagnetic layer 30. The magnetization direction of the first ferromagnetic layer 10 is antiparallel to the magnetization direction of the third ferromagnetic layer 30. Thus, the magnetic memory element 100 exhibits a high resistance value.

In the case of using, e.g., $Co_2FeAl_{0.5}Si_{0.5}$ as the material of the second ferromagnetic layer 20, the electrons of the second band of the second ferromagnetic layer 20 can be caused by employing a voltage lower than 0.6 volts (V) to contribute to electrical-conduction. In the case of causing the electrons of the first band of the second ferromagnetic layer 20 to contribute to electrical-conduction, a voltage of 0.6 V or higher is used. In the case of using, e.g., $Co_2Mn_{0.5}Fe_{0.5}Si$ as the material of the second ferromagnetic layer 20, the electrons of the second band of the second ferromagnetic layer 20 can be caused by employing a voltage lower than 0.5 V to contribute to electrical-conduction. In the case of causing the electrons of the first band of the second ferromagnetic layer 20 to contribute to electrical-conduction, a voltage of 0.5 V or higher is used. Such voltage values are examples. Therefore, voltage values may vary according to the design or the like of the magnetic memory element 100.

Ideally, the half metal contained in the second ferromagnetic layer 20 is completely crystallized. However, the half metal doesn't necessarily have to be completely crystallized. That is, when the electrons of the second band mainly contribute to electrical-conduction, the electrons of the first band can contribute somewhat to electric-conduction. On the other hand, when the electrons of the first band mainly contribute to electric-conduction, the electrons of the second band can contribute somewhat to electric-conduction.

The description has been made by assuming that the electrons of the second band of the first ferromagnetic layer 10 contribute to the operation. However, the electrons of the first band of the first ferromagnetic layer 10 can be assumed to contribute to the operation. This difference is caused by the number of electrons at the Fermi level $E_F$.

The description has been made by assuming that the second band of the second ferromagnetic layer 20 is continuous, and that the first band of the second ferromagnetic layer 20 includes the electric-conduction band and the valence band. However, it can be assumed that the second band of the second ferromagnetic layer 20 includes the electric-conduction band and the valence band, and that the first band of the second ferromagnetic layer 20 is continuous.

Figure 5:
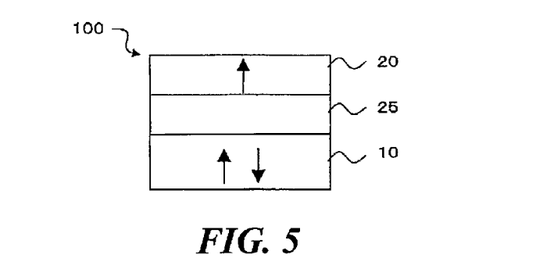
FIG. 5 illustrates still another example of the first embodiment.

The magnetic memory element 100 has been described by being assumed to include the second ferromagnetic layer 20. However, the magnetic memory element 100 can be configured such that the nonmagnetic layer 25 is provided between the second ferromagnetic layer 20 and the first ferromagnetic layer 10 without using the third ferromagnetic layer 30, as illustrated in FIG. 5.

Second Embodiment

Figure 6:
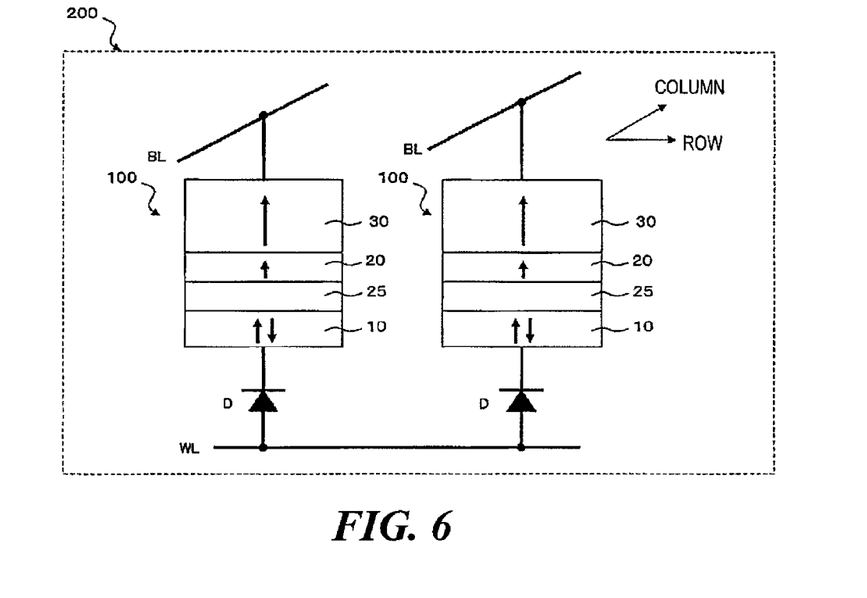
FIGS. 6 to 8 illustrate a magnetic memory element according to a second embodiment.

FIG. 6 illustrates a magnetic memory device 200 according to a second embodiment.

The magnetic memory device 200 includes plural magnetic memory elements 100 provided in a column direction and a row direction. The magnetic memory elements 100 are arranged at positions at each of which a word line WL and a bit line BL intersect with each other. A rectifying device D is provided between each magnetic memory element 100 and each word line WL. This is intended to prevent a sneak current from being generated in the magnetic memory device 200. The rectifying device D can be provided between each magnetic memory 100 and each bit line BL.

The rectifying device D can be a Coulomb-blockade device.

Figure 7:
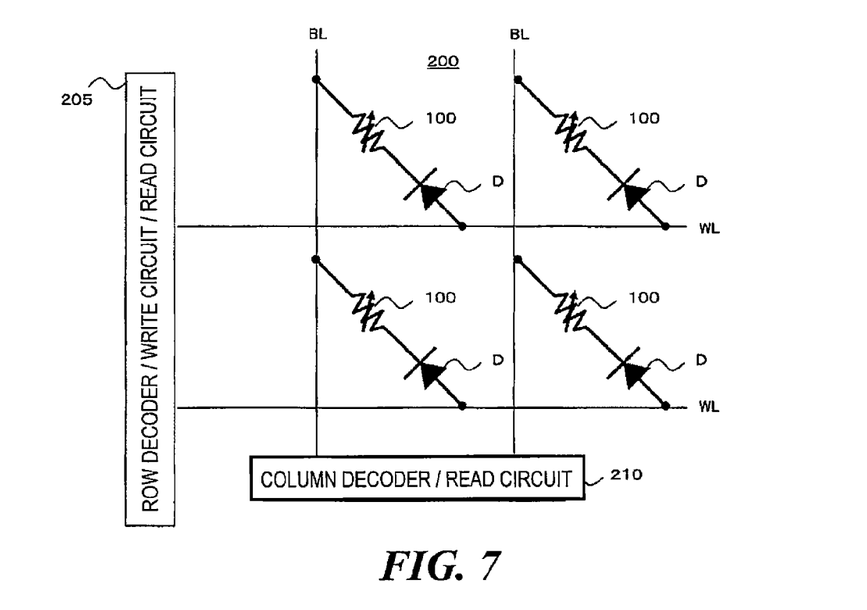

FIG. 7 illustrates a specific example of the magnetic memory device 200.

The magnetic memory device 200 includes the magnetic memory elements 100 arranged in the row direction, and the column direction, plural word lines WL, plural bit lines BL respectively intersecting with the word lines WL, a row-decoder/write-circuit/read-circuit 205, and a column-decoder/read-circuit 210.

Figure 8:
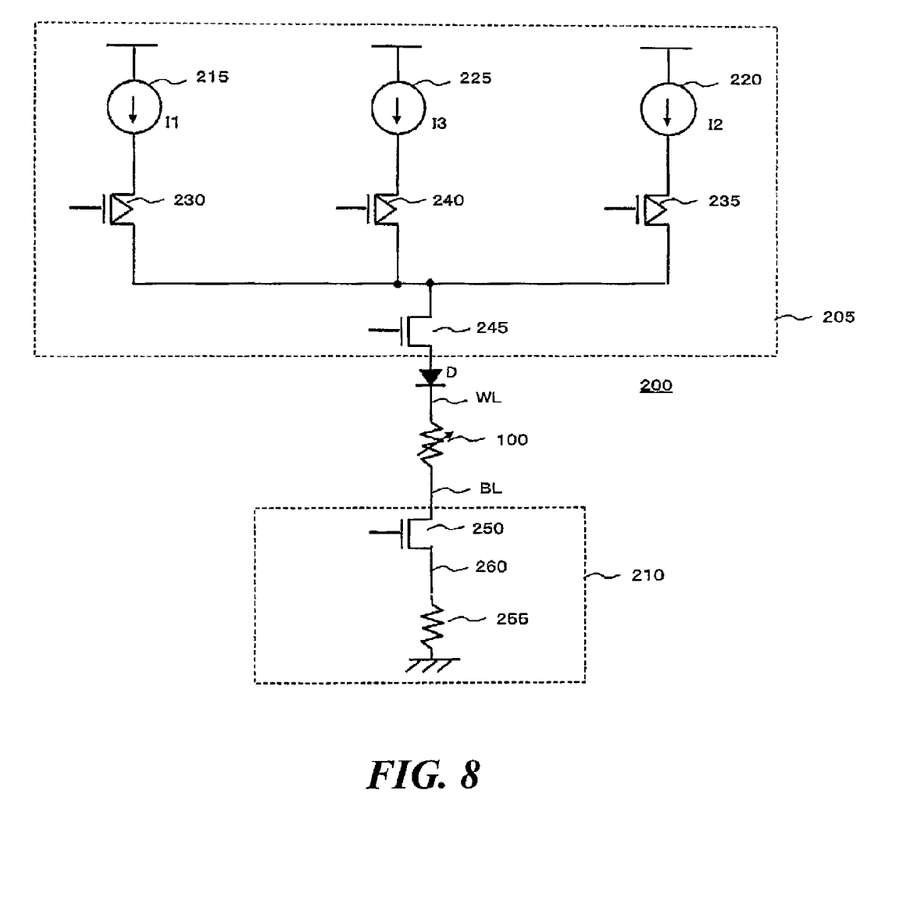

FIG. 8 illustrates the row-decoder/write-circuit/read-circuit 205 and the column-decoder/read-circuit 210. The row-decoder/write-circuit/read-circuit 205 includes three current sources 215, 220, and 225, three switches 230, 235, and 240 each including a p-type metal-oxide-semiconductor (MOS) transistor, and a selection transistor 245 including, e.g., an n-type MOS transistor provided corresponding to each word line WL. The intensities of electric-currents respectively generated from the current sources 215, 220, and 225 are designated with reference numerals I1, I2, and I3. The intensities of the electric-currents are assumed to satisfy the following inequality: I2<I1<I3. The current source 215 and the switch 230 are connected in series to each other and configure a first series circuit. The current source 220 and the switch 235 are connected in series to each other and configure a second series circuit. The current source 225 and the switch 240 are connected in series to each other and configure a third series circuit. The first series circuit and the third series circuit configure a write circuit. The second series circuit configures a read circuit. Each of the first series circuit, the second series circuit, and the third series circuit is connected to one terminal of the selection transistor 245. The other terminal of the selection transistor 245 is connected to an associated word line WL.

The column-decoder/read-circuit 210 includes a selection transistor 250 which includes an n-type MOS transistor provided corresponding to a bit line BL, and a resistor 255. The selection transistor 250 is connected to the associated bit line BL at one terminal thereof, and to the ground at the other terminal thereof via the resistor 255.

Next, an operating principle of the magnetic memory device 200 is described.

Figure 9A:
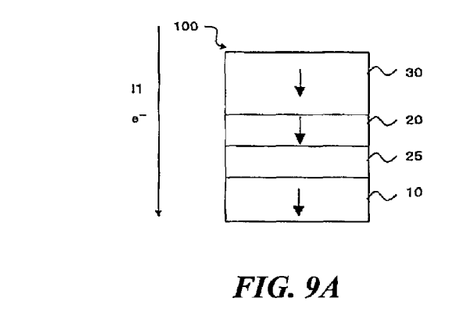
FIGS. 9A and 9B illustrate an operation of the second embodiment.

First, a write operation using electric-current I1 is described hereinafter, which is performed such that the magnetization direction of the first ferromagnetic layer 10 of the magnetic memory element 100 is set, as illustrated in FIG. 9A.

In this case, a control signal is sent to the gate of the selection transistor 245 by the row-decoder/write-circuit/read-circuit 205 thereby to turn on the selection transistor 245. In addition, a control signal is sent to the gate of the selection transistor 250 by the column-decoder/read-circuit 210 thereby to turn on the selection transistor 250. Thus, the magnetic memory element 100 that performs the writing of information is selected. Next, a control signal is sent from the row-decoder/write-circuit/read-circuit 205 to the gate of the switch 230 thereby to turn on the switch 230. Then, a write current I1 flows from the current source 215 through the switch 230 into the magnetic memory element 100. Thus, a write operation is performed on the selected magnetic memory element 100. The above write operation is finished by sending a control signal from the row-decoder/write-circuit/read-circuit 205 to the gate of the switch 230 thereby to turn off the switch 230.

Figure 9B:
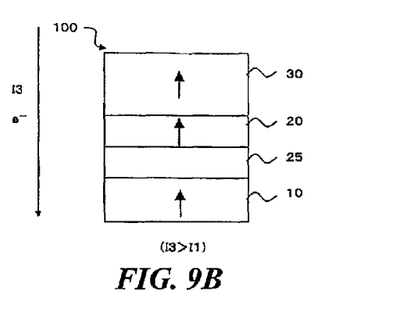

Next, a write operation using electric-current I3 is described hereinafter, which is performed such that the magnetization direction of the first ferromagnetic layer 10 of the magnetic memory element 100 is set, as illustrated in FIG. 9B.

A magnetic memory element to which information is written is selected, similarly to the above write operation. Next, a control signal is sent from the row-decoder/write-circuit/read-circuit 205 to the gate of the switch 240 thereby to turn on the switch 240. Then, a write current I3 flows from the current source 225 through the switch 240 into the selected magnetic memory element 100. Thus, information is written to a selected memory cell such that the ferromagnetic layer 10 has the magnetization direction illustrated in FIG. 9B. The above write operation is finished by sending a control single to the gate of the switch 240 from the row-decoder/write-circuit/read-circuit 205.

Next, a read operation is described. A memory cell from which information is read is selected similarly to the above read operation. Subsequently, a control signal is sent from the row-decoder/write-circuit/read-circuit 205 to the gate of the switch 235 to thereby turn on the switch 235. Then, a read current I2 flows from the current source 220 to the gate of the switch 235 thereby to turn on the switch 235. At that time, a voltage corresponding to the magnetization direction of the first ferromagnetic layer 10 of the selected magnetic memory element 100 appears at a connection node 260 between the selection transistor 250 and the resistor 255. It can be determined by reading the voltage of the connection node 260 which of a high resistance state and a low resistance state the present state of the selected magnetic memory element 100 is. The column-decoder/read-circuit 210 includes a device for reading the voltage of the connection node 260, and that for determining, based on the above voltage, which of the high resistance state and the low resistance state the present state of the selected magnetic memory element 100 is (these devices are not shown in FIG. 8).

As described above, the magnetic memory device 200 is such that information can be written thereto using unidirectional electric-current, and that the area of the circuit can be prevented from being increased.

According to the band structure of the ferromagnetic material used as that of the magnetic memory element, the magnetic memory element can be configured such that the relative magnetization direction between the second ferromagnetic layer 20 and the first ferromagnetic layer 10 becomes substantially antiparallel (or substantially parallel) to each other after the electric-current is caused to flow therein. Similarly, the magnetic memory element can be set in a high resistance state (or a low resistance state) after the electric-current is caused to flow therein.

Example 1

The magnetic memory device 200 is manufactured.

First, the following layers are sequentially formed by a sputtering method on a silicon substrate on which a rectifying device is formed. That is, a laminated film (base electrode) formed of Ta-film (50 nm in thickness)/Ru-film (10 nm in thickness), a TbFeCo-layer (6 nm in thickness and corresponding to the first ferromagnetic layer 10), a MgO-layer (0.8 nm in thickness and corresponding to the nonmagnetic layer 25), a $Co_2FeAl_{0.5}Si_{0.5}$ (3 nm in thickness and corresponding to the second magnetic layer 20), a GdFeCo-layer (3 nm in thickness and corresponding to the third ferromagnetic layer 30), and a Ta-layer (150 nm in thickness and corresponding to a contact layer) are formed.

Patterning of tunnel junctions is performed using an ArF stepper device. After that, the junctions are separated using Ar-ion milling. Next, a protection film made of $SiO_x$ (0<x<1) having a thickness of 35 nm is formed. Then, the patterning of an electrode formed of a Ta/Ru-film is formed. Subsequently, etching is performed by Ar-ion milling. Next, an interlayer insulating film made of $SiO_x$ (0<x<1) is formed. Then, a contact layer is exposed by etching back the film. Next, contact-cleaning is performed. Then, an upper electrode formed of Ti-film (15 nm in thickness)/Al-film (300 nm in thickness)/Ti-film (15 nm in thickness) is sputtered. Finally, etching is performed thereon by a reactive ion etching (RIE) method.

The spin injection magnetization switching is tried on the magnetic memory device 200 manufactured by the above procedure.

First, a write electric-current having an electric-current density (J1) of $4 \times 10^5$ amperes (A)/square-centimeters ($cm^2$) is applied to the junction. After that, a read current having an electric-current density of $5 \times 10^4$ $A/cm^2$ (J2) is applied thereto. Then, the resistance of the magnetic memory element of the magnetic memory device 200 is measured. Accordingly, the resistance of the magnetic memory element is 11 ohms ($\Omega$)·square meters ($m^2$) in terms of a resistance-area (RA) product. Next, a write electric-current having an electric-current density (J3) of $8 \times 10^6$ $A/cm^2$ is applied to the junction. After that, a read current having an electric-current density of $5 \times 10^4$ $A/cm^2$ (J2) is applied thereto. Then, the resistance of the magnetic memory element of the magnetic memory device 200 is measured. Accordingly, the resistance of the magnetic memory element is $22\Omega \cdot m^2$ in terms of the RA product. The electric-currents J1, J2, and J3 are applied in the same direction.

A result reveals that a low-resistance state and a high-resistance state can be written to the present spin memory using unidirectional electric-current.

Third Embodiment

Figure 10:
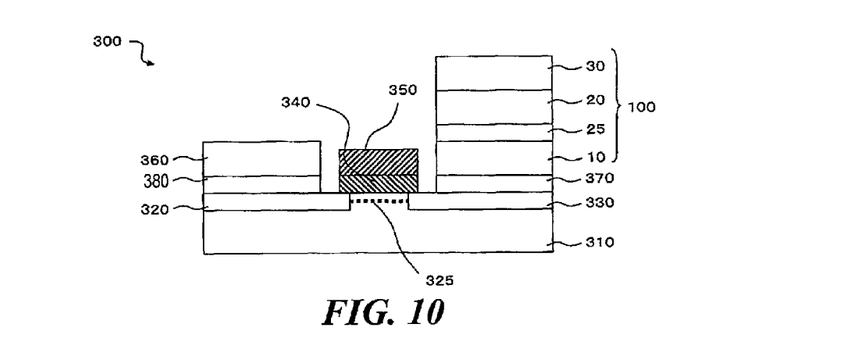
FIG. 10 illustrates a spin transistor according to a third embodiment.

FIG. 10 illustrates a spin transistor 300 according to a third embodiment.

The spin transistor 300 includes a semiconductor layer 310, a source region 320 and a drain region 330 provided separately from each other in the semiconductor layer 310, a gate insulating film 340 provided between the source region 320 and the drain region 330 on the semiconductor layer 310, and a gate electrode 350 provided on the gate insulating film 340. A nonmagnetic layer 380 is provided on the source region 320 of the semiconductor layer 310. A fourth ferromagnetic layer 360 is provided on the nonmagnetic layer 380. A nonmagnetic layer 370 is provided on the drain region 330 of the semiconductor layer 310. The first ferromagnetic layer 10, the nonmagnetic layer 25, the second ferromagnetic layer 20, and the third ferromagnetic layer 30 are provided on the nonmagnetic layer 370 in this order.

n-type silicon, p-type silicon, Ge, $Si_xGe_{1-x}$ (0<x<1), a III-V group compound-semiconductor, a II-VI group compound-semiconductor, or the like can be used as the material of the semiconductor layer 310. Alternatively, the semiconductor layer 310 can be a silicon-on-insulator (SOI) substrate, a germanium-on-insulator (GOI) substrate, a silicon-germanide-on-insulator (SGOI) substrate, a substrate in which a III-V group compound-semiconductor layer is formed on an insulator, or a substrate in which a II-V group compound-semiconductor is formed on an insulator.

A channel region 325 in which a spin propagates is formed between the source region 320 and the drain region 330. The spin transistor 300 is assumed to be a p-type one having the source region 320 and the drain region 330 in each of which a p-type impurity is formed.

However, the spin transistor 300 can be configured such that the nonmagnetic layer 370, the first ferromagnetic layer 10, the nonmagnetic layer 25, the second ferromagnetic layer 20, and the third ferromagnetic layer 30 are provided on the source region 320, and that the nonmagnetic layer 380 and the fourth ferromagnetic layer 360 are provided on the drain region 330.

That is, the magnetic memory element 100 is provided on the source region 320 or the drain region 330.

Electric-current flowing through the fourth ferromagnetic layer 360 and the magnetic memory element 100 depends upon a voltage applied to the gate electrode 350 and upon the relative magnetization direction between the fourth ferromagnetic layer 360 and the first ferromagnetic layer 10. That is, when the voltage is applied to the gate electrode 350, if the relative magnetization direction between the fourth ferromagnetic layer 360 and the first ferromagnetic layer 10 is substantially parallel to each other, large electric-current flows therebetween. However, if the relative magnetization direction between the fourth ferromagnetic layer 360 and the first ferromagnetic layer 10 is antiparallel to each other, an amount of electric-current flowing therebetween is small.

The spin transistor 300 is such that the magnetization direction of the first ferromagnetic layer 10 can be changed by applying electric-currents differing in intensity to the magnetic memory element 100 from the fourth ferromagnetic layer 360 through the channel region 325 (in a direction opposite to the direction of an electron flow). That is, the magnetization direction of the first ferromagnetic layer 10 can be changed using only unidirectional electric-current.

If the spin transistor 300 is of the n-type, the semiconductor layer 310 is formed of a p-type one, while each of the source region 320 and the drain region 330 is formed of an n-type impurity.

Figure 11:
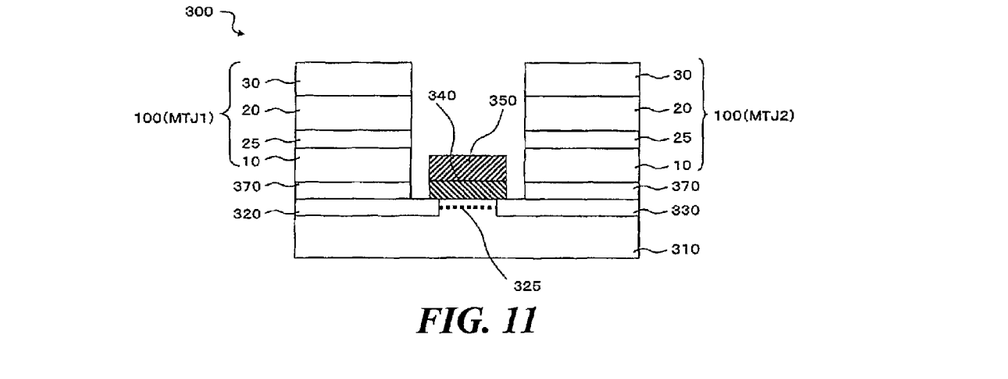
FIGS. 11 to 13 illustrate other examples of the third embodiment.

As illustrated in FIG. 11, the magnetic memory element 100 can be provided on each of both the source region 320 and the drain region 330. At that time, the magnetic memory element 100 provided on a left-side part of the drawing sheet of FIG. 11 is designated with reference numeral MTJ1, while that 100 provided on a right-side part of the drawing sheet is designated with reference numeral MTJ2.

FIGS. 10 and 11 illustrate metal oxide semiconductor field effect transistor (MOSFET) structures each of which is provided with the gate insulating film 340.

Figure 12:
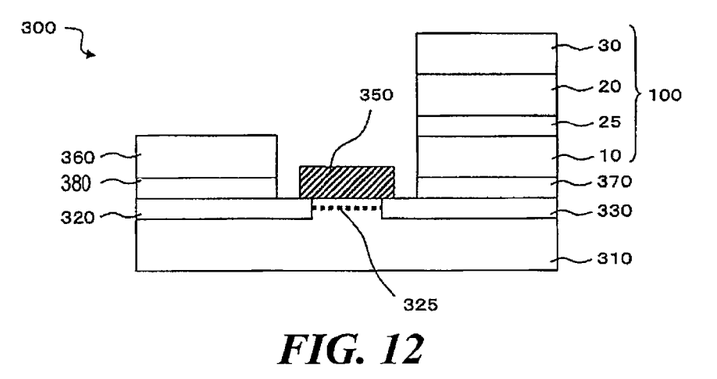
Figure 13:
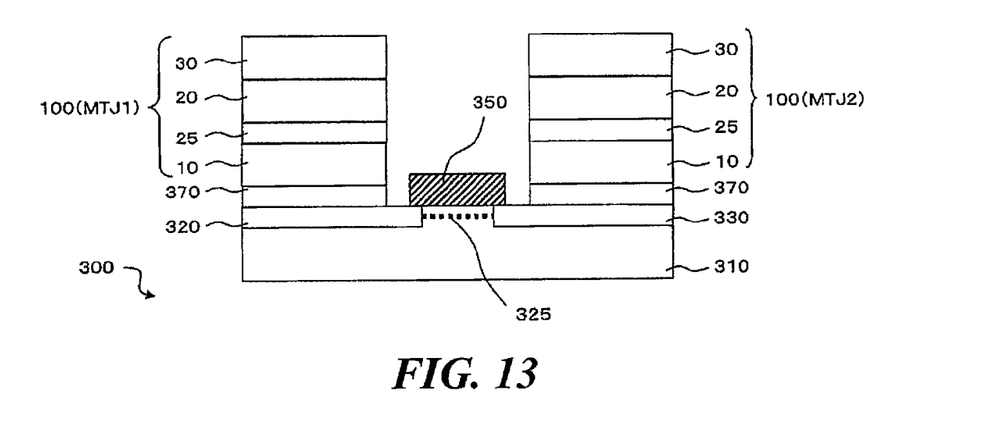

The spin transistor 300 can have a metal semiconductor field effect transistor (MESFET) structure obtained by removing the gate insulating film 340 from each of the structures respectively illustrated in FIGS. 12 and 13. If the gate electrode 350 and the semiconductor layer 310 of the MESFET structure differ from each other in conductivity type, the spin transistor 300 can be used as a junction-gate field effect transistor (JFET).

The magnetic memory element 100 and the magnetic memory device 200 can employ a verify write method in order to check whether the writing of intended information has properly been performed. If the writing of the intended information has not properly been achieved, in order to increase the probability of achieving the writing of the intended information, it is advisable to perform the writing by increasing a write pulse duration, or to perform the writing plural times. Alternatively, it is useful to increase or decrease a write electric-current according to a result of reading the information to thereby perform the writing again. For example, if the writing cannot be achieved with the electric-current I3, the writing is performed again with electric-current larger than the electric-current I3. If the writing cannot be achieved with the electric-current I1, the writing is performed again with electric-current smaller than the electric-current I1.

Because the spin transistor 300 enables the writing of information using unidirectional electric-current, the peripheral circuit can be simplified. In addition, the spin transistor 300 assures compatibility with normal logic circuits.

The type of the channel region is not limited to an enhancement type. A channel region of the depression type can be used. A manufacturing method for the channel region is not limited to an ion implantation method. The channel region can be manufactured by a hetero-interface growth process utilizing modulation-doping.

A dynamic random access memory (DRAM) can be configured by combining the spin transistor 300 with a dielectric capacitor. A ferroelectric random access memory (FRAM) can be configured by combining the spin transistor 300 with a ferroelectric capacitor. An MRAM can be configured by combining the spin transistor 300 with a tunnel magnetoresistance device. In addition, the spin transistor 300 can be applied to a transistor for an electrically erasable programmable read-only memory (EEPROM) which is a programmable read-only memory configured such that data is electrically written thereto and erased therefrom.

In addition, the spin transistor 300 can be utilized as a memory. That is, the spin transistor 300 can be used as a storage portion for storing information representing the magnetization direction of the first ferromagnetic layer 10. Data is read therefrom utilizing a magnetoresistance effect caused between the first ferromagnetic layer 10 and the third ferromagnetic layer 30.

Example 2

The spin transistor 300 illustrated in FIG. 11 is manufactured.

First, an isolation zone, a gate insulating film, and a gate electrode are formed using an ordinary complementary metal oxide semiconductor (CMOS) process. Next, ion implantation and activation annealing are performed thereon. Then, a side wall is formed. After that, a MgO-layer (0.6 nm in thickness and corresponding to the nonmagnetic layer 370), a GdFeCo-layer (3 nm in thickness and corresponding to the first ferromagnetic layer 10) MgO-layer (0.8 nm in thickness and corresponding to the nonmagnetic layer 25), a $Co_2FeAl_{0.5}Si_{0.5}$ (3 nm in thickness and corresponding to the second magnetic layer 20), a TbFeCo-layer (6 nm in thickness and corresponding to the third ferromagnetic layer 30), and a contact-layer (150 nm in thickness and corresponding to a contact layer) made of Ta are sequentially formed by the sputtering method.

Patterning of tunnel junctions is performed using the ArF stepper device. After that, the junctions are separated using Ar-ion milling. Next, a protection film made of $SiO_x$ ($0<x<1$) having a thickness of 200 nm is formed. Then, the patterning of an electrode formed of a Ta/Ru-film is formed. Subsequently, a contact layer is exposed by etching back the film. After that, contact-cleaning is performed. Then, an upper electrode formed of Ti-film (15 nm in thickness)/Al-film (300 nm in thickness)/Ti-film (15 nm in thickness) is sputtered. Finally, etching is performed thereon by the RIE method.

The spin injection magnetization switching is tried on the spin transistor manufactured by the above procedure.

First, the channel is caused by applying a voltage to the gate electrode to conduct. Next, a write electric-current is applied between the third ferromagnetic layer 30 of the magnetic memory element MTJ2 and that 30 of the magnetic memory element MTJ1. At that time, an electric-current density (J1) into which an amount of electric-current applied therebetween is converted corresponding to the junction area of the magnetic memory element MTJ2 is $4\times10^5$ A/cm$^2$ (since then, the electric-current density is determined corresponding to the junction area of the magnetic memory element MTJ2). Next, the resistance between the ferromagnetic layer F1 of the magnetic memory element MTJ1 and that F1 of the magnetic memory element MTJ2 is measured by applying a read current having an electric-current density (J2) of $5\times10^4$ A/cm$^2$ thereto. The value of the measured resistance is 101Ω. Next, a write electric-current having an electric-current density (J3) of $8\times10^6$ A/cm$^2$ is applied to the junction. After that, a read current having an electric-current density (J2) of $5\times10^4$ A/cm$^2$ is applied thereto. Then, the resistance of the magnetic memory element is measured. Accordingly, the resistance of the spin transistor 300 is 132Ω. The electric-currents J1, J2, and J3 are applied in the same direction.

A result reveals that a low-resistance state and a high-resistance state can be written to the spin transistor 300 using unidirectional electric-current.

Fourth Embodiment

Figure 14:
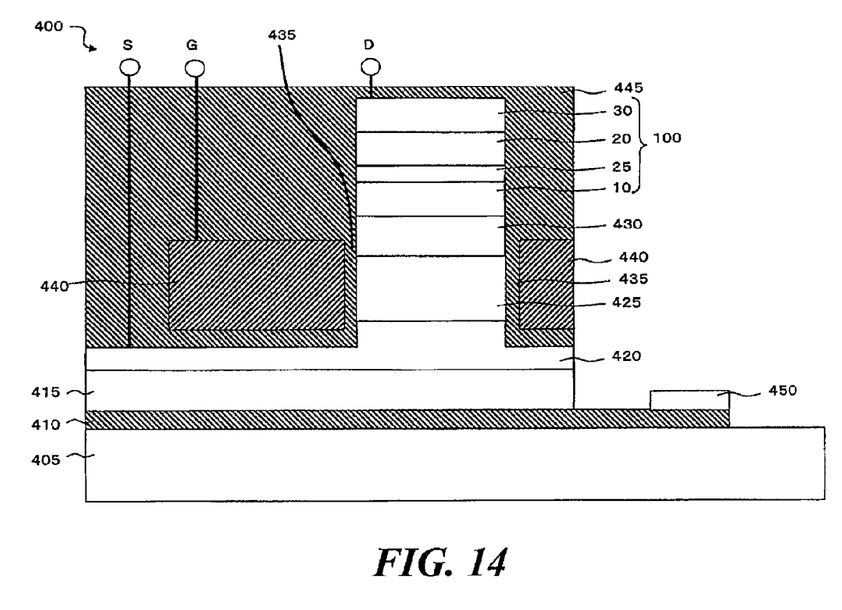
FIG. 14 illustrates a spin transistor according to a fourth embodiment.

FIG. 14 illustrates a vertical spin transistor 400 according to a fourth embodiment.

An embedded insulating film 410, a semiconductor layer 415, and a source layer 420 are provided on the semiconductor substrate 405. A part of the source layer 420 is protruded. A semiconductor layer 425, the drain layer 430, the first ferromagnetic layer 10, the nonmagnetic layer 25, the second ferromagnetic layer 20, and the third ferromagnetic layer 30 are provided on the protruded part of the source layer 420. That is, the magnetic memory element 100 is provided on the drain layer 430. The source layer 420 can be replaced with the drain layer 430. A first conductivity type layer can be represented as the source layer 420, while a second conductivity type layer can be represented as the drain layer 430. The same conductivity type can be used as the first conductivity type and the second conductivity type.

A gate insulating film 435 and a gate electrode 440 are provided on the side wall of each of the protruded part of the source layer 420, the semiconductor layer 425, and the drain layer 430. The side wall of the semiconductor layer 425, that of the drain layer 430, and the side wall and the top surface of the magnetic memory element 100 provided on the source layer 420 are surrounded by an insulating film 445. FIG. 14 illustrates a pair of the gate electrodes 440. However, even if only one gate electrode 440 is provided, the gate electrode 440 can be applied to the spin transistor 400. The gate electrode 440 can be provided to surround the semiconductor layer 425, the source layer 420, and the drain layer 430 via the gate insulating film 435. At least one gate electrode 440 can be provided adjacent to the semiconductor layer 425 via the gate insulating film 435.

And, another semiconductor layer 450 is provided on a part of the embedded insulating film 410. A transistor and the like are provided on the semiconductor layer 450. However, the semiconductor layer 450 can be removed.

$Fe_3Si$ or a full-Heusler alloy can be used as the material of each of the source layer 420 and the drain layer 430.

The spin transistor 400 is an n-type transistor (thus, the semiconductor layer 425 is a p-type semiconductor) or a p-type transistor (thus, the semiconductor layer 425 is an n-type semiconductor).

The spin transistor 400 is such that electric-current flowing between the source layer 420 and the magnetic memory element 100 depends upon the voltage applied to the gate electrode 440 and the relative magnetization direction between the source layer 420 and the first ferromagnetic layer 10. That is, when a voltage is applied to the gate electrode 440, if the relative magnetization direction between the source layer 420 and the first ferromagnetic layer 10 is substantially parallel to the magnetization of the ferromagnetic layer 10, large electric-current flows therebetween. However, if the relative magnetization direction between the source layer 420 and the first ferromagnetic layer 10 is substantially antiparallel to the magnetization of the ferromagnetic layer 10, an amount of electric-current flowing therebetween is small.

The spin transistor 400 can change the magnetization direction of the first ferromagnetic layer 10 using only unidirectional electric-current.

The spin transistor 400 can employ a verify write method in order to check whether the writing of intended information has properly been performed. If the writing of the intended information has not properly been achieved, in order to increase the probability of achieving the writing of the intended information, it is advisable to perform the writing by increasing a write pulse duration, or to perform the writing plural times. Alternatively, it is useful to increase or decrease a write electric-current according to a result of reading the information to thereby perform the writing again. For example, if the writing cannot be achieved with the electric-current I3, the writing is performed again with electric-current larger than the electric-current I3. For example, if the writing cannot be achieved with the electric-current I1, the writing is performed again with electric-current smaller than the electric-current I1.

Because the spin transistor 400 enables the writing of information using unidirectional electric-current, the peripheral circuit can be simplified. In addition, the spin transistor 400 assures compatibility with normal logic circuits.

Fifth Embodiment

Figure 15:
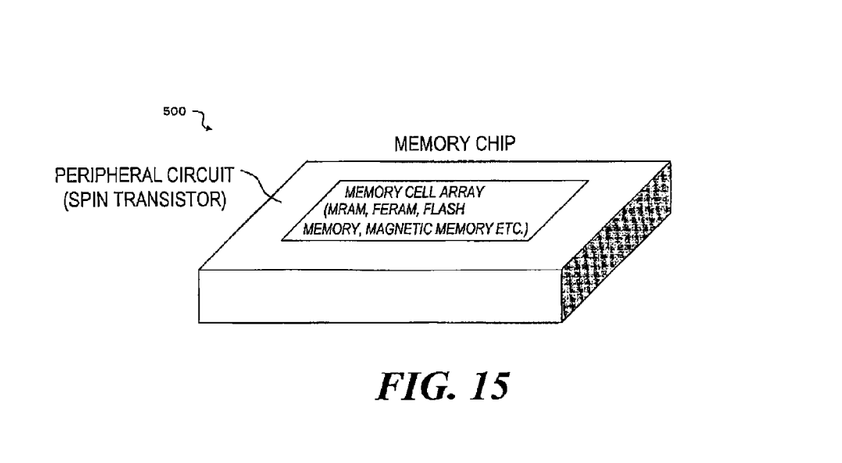
FIG. 15 illustrates a memory chip according to a fifth embodiment.

FIG. 15 illustrates a memory chip 500 according to a fifth embodiment.

The spin transistors 300 and 400 are used at the peripheral circuit of the magnetic memory element. A memory cell array is, e.g., an MRAM, a ferroelectric random access memory (FeRAM), or a flash memory (a NAND-type flash memory, a NOR-type flash memory, or the like). The magnetic memory element 100 or the magnetic memory device 200 can be used as the memory cell array.

Sixth Embodiment

Figure 16:
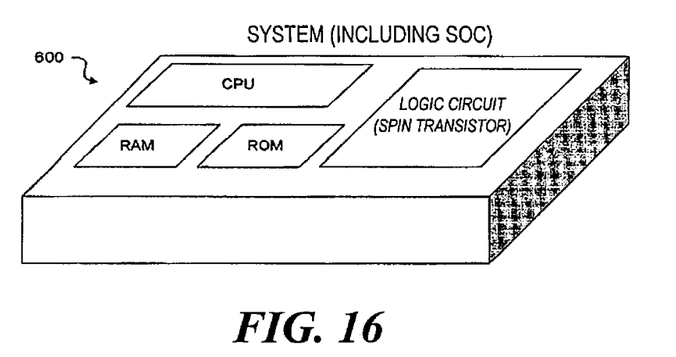
FIG. 16 illustrates an integrated circuit according to a sixth embodiment.

FIG. 16 illustrates an integrated circuit 600 according to a sixth embodiment. The integrated circuit 600 is a system large-scale integrated-circuit (LSI). The integrated circuit 600 includes a system-on-chip (SoC).

The spin transistors 300 and 400 are used in logic circuits configuring the integrated circuit 600. A central processing unit (CPU) can be configured by ordinary CMOS circuits. Alternatively, the CPU can be configured by the spin transistors 300 and 400.

A semiconductor memory or magnetic memory 200 using the spin transistors 300 and 400 as memory cells can be employed as the read-only memory (ROM), in addition to a nonvolatile semiconductor memory such as a flash memory.

Figure 17:
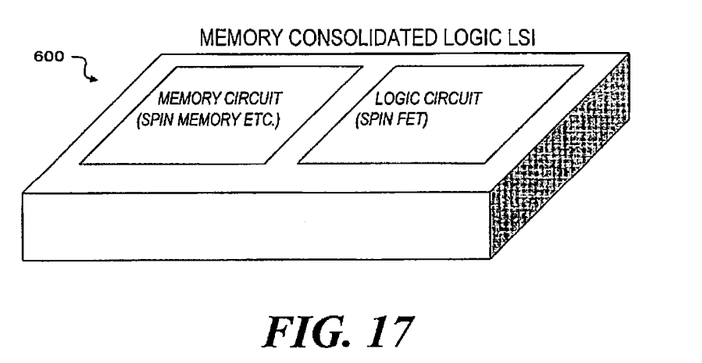
FIG. 17 illustrates another example of the sixth embodiment.

A random access memory (RAM) is configured by a memory, such as a static-RAM (SRAM) or a DRAM, capable of performing an operation at a high speed. The integrated circuit 600 can be a memory consolidated logic LSI, as illustrated in FIG. 17. The spin transistors 300 and 400 are used in a logic circuit. A semiconductor memory using the spin transistors 300 and 400 as memory cells, the magnetic memory elements 100, or the magnetic memory device 200 can be used as a memory circuit.

Although the embodiments have been exemplified, the embodiments should not limit the scope of the inventions. The embodiments can be embodied in other various forms with various omissions, substitutions and changes, without departing from the spirit of the invention. The embodiments and such modifications thereof will fall within the scope and spirit of the invention, and within the scope of Claims and equivalents thereof.

The invention claimed is:

1. A magnetic memory element, comprising:
   a first ferromagnetic layer whose magnetization is variable;
   a second ferromagnetic layer which has a first band split into a valence band and a conduction band and a second band being continuous at least from the valence band to the conduction band; and
   a nonmagnetic layer provided between the first ferromagnetic layer and the second ferromagnetic layer,
   wherein reading is performed by causing electrons to flow between the first ferromagnetic layer and the second ferromagnetic layer, and
   wherein writing is performed by
      applying a voltage corresponding to energy equal to or less than an energy difference from a Fermi level to the valence band of the second ferromagnetic layer between the first ferromagnetic layer and the second ferromagnetic layer, to thereby perform spin-injection of electrons of the second band of the second ferromagnetic layer into the first ferromagnetic layer, or
      applying a voltage corresponding to energy larger than the energy difference between the first ferromagnetic layer and the second ferromagnetic layer, to thereby perform spin-injection of electrons of the first band of the second ferromagnetic layer into the first ferromagnetic layer.

2. The magnetic memory element of claim 1, further comprising:
   a third ferromagnetic layer whose magnetization is fixed, provided on a side of the second ferromagnetic layer opposite to the nonmagnetic layer,
   wherein electrons are caused to flow between the third ferromagnetic layer and the first ferromagnetic layer.

3. A magnetic memory device, comprising:
   a plurality of first wirings provided in a column direction;
   a plurality of second wirings provided in a row direction;
   a plurality of magnetic memory elements according to claim 1 respectively provided at intersection positions of the first wirings and the second wirings, the magnetic memory elements being respectively provided between the first wirings and the second wirings; and
   a plurality of rectifying devices respectively provided between the magnetic memory elements and the second wirings.

4. The magnetic memory device of claim 3,
wherein the writing includes
first writing using a first write current to make a magnetization direction of the first ferromagnetic layer substantially antiparallel to a magnetization direction of the second ferromagnetic layer, and
second writing using a second write current larger than the first write current to reverse the magnetization direction of the first ferromagnetic layer to be substantially parallel to the magnetization direction of the second ferromagnetic layer, and
wherein the reading is performed using a read current smaller than the first write current.

5. The magnetic memory device of claim 3,
wherein the writing includes
first writing using a first write current to make a magnetization direction of the first ferromagnetic layer substantially parallel to a magnetization direction of the second ferromagnetic layer, and
second writing using a second write current larger than the first write current to reverse the magnetization direction of the first ferromagnetic layer to be substantially antiparallel to the magnetization direction of the second ferromagnetic layer, and
wherein the reading is performed using a read current smaller than the first write current.

6. The magnetic memory device of claim 3, further comprising:
a write circuit configured to supply a first write current and the second write current to the magnetic memory element; and
a read circuit configured to supply a read current to the magnetic memory element.

7. A spin transistor, comprising:
a semiconductor layer;
a source region and a drain region provided in the semiconductor layer to be separated from each other;
a gate electrode provided on the semiconductor layer between the source region and the drain region;
a first ferromagnetic layer whose magnetization is variable, provided on the source region or the drain region;
a nonmagnetic layer provided on the first ferromagnetic layer; and
a second ferromagnetic layer which has a first band split into a valence band and a conduction band and a second band being continuous at least from the valence band to the conduction band,
wherein reading is performed by causing electrons to flow between the first ferromagnetic layer and the second ferromagnetic layer, and
wherein writing is performed by
applying a voltage corresponding to energy equal to or less than an energy difference from a Fermi level to the valence band of the second ferromagnetic layer between the first ferromagnetic layer and the second ferromagnetic layer, to thereby perform spin-injection of electrons of the second band of the second ferromagnetic layer into the first ferromagnetic layer, or
applying a voltage corresponding to energy larger than the energy difference between the first ferromagnetic layer and the second ferromagnetic layer, to thereby perform spin-injection of electrons of the first band of the second ferromagnetic layer into the first ferromagnetic layer.

8. The spin transistor of claim 7, further comprising:
a third ferromagnetic layer whose magnetization is fixed, provided on a side of the second ferromagnetic layer opposite to the nonmagnetic layer,
wherein electrons are caused to flow between the third ferromagnetic layer and the first ferromagnetic layer.

9. The spin transistor of claim 7, further comprising:
a gate insulating film provided between the gate electrode and the semiconductor layer.

10. The spin transistor of claim 7,
wherein a conductivity type of a channel region formed between the source region and the drain region is opposite to that of the gate electrode.

11. The spin transistor of one of claim 7, further comprising:
a tunnel insulating film provided between the first ferromagnetic layer and the semiconductor layer.

12. A spin transistor, comprising:
a first conductive type layer;
a second conductivity type layer having a conductivity type which is the same as the first conductivity type;
a semiconductor layer provided between the first conductivity type layer and the second conductivity type layer;
at least one gate electrode provided adjacent to the semiconductor layer in a direction perpendicular to a direction in which the first conductivity type layer and the second conductivity type layer are connected to each other;
a gate insulating film provided between the gate electrode and the semiconductor layer;
a second ferromagnetic layer which is provided on a side of the first conductivity type layer opposite to the semiconductor layer, and which has a first band split into a valence band and a conduction band and a second band being continuous at least from the valence band to the conduction band;
a first ferromagnetic layer whose magnetization is variable, provided between the second ferromagnetic layer and the first conductivity type layer; and
a nonmagnetic layer provided between the first ferromagnetic layer and the second ferromagnetic layer,
wherein reading is performed by causing electrons to flow between the first ferromagnetic layer and the second ferromagnetic layer, and
wherein writing is performed by
applying a voltage corresponding to energy equal to or less than an energy difference from a Fermi level to the valence band of the second ferromagnetic layer between the first ferromagnetic layer and the second ferromagnetic layer, to thereby perform spin-injection of electrons of the second band of the second ferromagnetic layer into the first ferromagnetic layer, or
applying a voltage corresponding to energy larger than the energy difference between the first ferromagnetic layer and the second ferromagnetic layer, to thereby perform spin-injection of electrons of the first band of the second ferromagnetic layer into the first ferromagnetic layer.

13. The spin transistor of claim 12, further comprising:
a third ferromagnetic layer whose magnetization is fixed, provided on a side of the second ferromagnetic layer opposite to the nonmagnetic layer,
wherein electrons are caused to flow between the third ferromagnetic layer and the first ferromagnetic layer.

14. An integrated circuit using at least one magnetic memory element of claim 1.

15. An integrated circuit using at least one magnetic memory device of claim 3.

16. An integrated circuit using at least one spin transistor of claim 7.

17. An integrated circuit using at least one spin transistor of claim 12.

\* \* \* \* \*